United States Patent
Kuettner et al.

(10) Patent No.: US 8,810,254 B2
(45) Date of Patent: Aug. 19, 2014

(54) ARRANGEMENT FOR ELIMINATING INTERFERENCE FROM ACOUSTIC SIGNALS IN A GROUND-BORNE SOUND LOCATING PROCESS

(75) Inventors: Marco Kuettner, Dresden (DE); Marco Stephan, Dresden (DE)

(73) Assignee: Hagenuk KMT Kabelmesstechnik GmbH, Radeburg (DE)

( * ) Notice: Subject to any disclaimer, the term of this patent is extended or adjusted under 35 U.S.C. 154(b) by 265 days.

(21) Appl. No.: 13/288,087

(22) Filed: Nov. 3, 2011

(65) Prior Publication Data

US 2012/0105073 A1 May 3, 2012

(30) Foreign Application Priority Data

Nov. 3, 2010 (DE) .......................... 10 2010 050 375

(51) Int. Cl.
*G01R 31/08* (2006.01)
(52) U.S. Cl.
USPC ............................................ 324/536; 73/587
(58) Field of Classification Search
USPC .......................... 702/184–190; 324/536–544
See application file for complete search history.

(56) References Cited

U.S. PATENT DOCUMENTS

| | | | |
|---|---|---|---|
| 4,565,964 A | | 1/1986 | Matthews et al. |
| 4,835,478 A | * | 5/1989 | Haddon et al. ............... 324/536 |
| 4,851,782 A | * | 7/1989 | Jeerings et al. ............... 324/520 |
| 5,210,498 A | | 5/1993 | Paananen |
| 5,352,984 A | * | 10/1994 | Piesinger ..................... 324/532 |
| 5,428,295 A | | 6/1995 | Beeman |
| 8,264,226 B1 | | 9/2012 | Olsson et al. |
| 2010/0001713 A1 | * | 1/2010 | Royle ............................. 324/67 |
| 2010/0007354 A1 | * | 1/2010 | Deaver et al. ................ 324/539 |
| 2012/0006117 A1 | | 1/2012 | Kordon et al. |

* cited by examiner

*Primary Examiner* — Arleen M Vazquez
*Assistant Examiner* — Brent J Andrews
(74) *Attorney, Agent, or Firm* — W. F. Fasse

(57) ABSTRACT

An apparatus including a portable receiver with an acoustic sensor and a magnetic field sensor is adapted for locating a fault in an underground electrical line by evaluating ground-borne acoustic signals and electromagnetic signals emitted from a succession of sparking arc-overs caused at the fault location by voltage pulses fed into the electrical line. The apparatus further includes an arrangement for eliminating interference noises from the acoustic signals, wherein the acoustic received signals are delivered to and stored in a memory, and then a respective acoustic signal is processed with reference to or in combination with a previous stored acoustic signal by a processing algorithm in a processing unit so as to reduce or suppress the acoustic interference noises in the acoustic signals. Start time points of the individual acoustic signals are synchronized with reference to associated electromagnetic signals. A result of the processing algorithm is supplied to an evaluating unit.

20 Claims, 3 Drawing Sheets

ARRANGEMENT FOR ELIMINATING INTERFERENCE FROM ACOUSTIC SIGNALS IN A GROUND-BORNE SOUND LOCATING PROCESS

CROSS-REFERENCE TO RELATED APPLICATION

This application is related to U.S. patent application Ser. No. 13/178,682 filed on Jul. 8, 2011, the entire disclosure of which is incorporated herein by reference.

PRIORITY CLAIM

This application is based on and claims the priority under 35 USC 119 of German Patent Application 10 2010 050 375.4, filed on Nov. 3, 2010, the entire disclosure of which is incorporated herein by reference.

FIELD OF THE INVENTION

The invention relates to an arrangement for eliminating interference from acoustic signals in a ground-borne sound locating process for locating a fault in an underground buried electrical line by localization of the acoustic signals produced by sparking arc-overs at the fault location due to a succession of voltage pulses applied to the electrical line by a connected surge or shock voltage device.

BACKGROUND INFORMATION

Arrangements of the above general type are known for acoustic post-locating or fine locating of faults in buried electrical lines. Such arrangements may include a receiver unit consisting of a magnetic field sensor, an acoustic sensor and an indicator or display unit, for detecting the electromagnetic signals and the acoustic signals emitted by the fault at the fault location when voltage pulses are applied to the electrical line. Then the fault can be located by evaluating the acoustic signals in connection with the electromagnetic signals.

The deficiency in such a post-locating or fine locating is that external acoustic interference noises often arise and are superimposed on the actual useful acoustic signals emitted by the electrical fault, which impairs or prevents an exact ground-borne noise location. These interference sources exist in environmental influences, such as wind and rain, street traffic and pedestrians, which make noises that are acoustically superimposed on the useful signal.

SUMMARY OF THE INVENTION

In view of the above, it is an object of the invention to achieve a considerable reduction or elimination of interference from the received acoustic signals and thereby considerably improve the ability to accurately analyze or interpret the acoustic signals, which have been processed to eliminate or reduce interference and then output through an audio channel, for example. This is to make possible a more accurate and reliable localization of cable faults through a ground-borne noise location process. In this regard, it is a further object of the invention that the useful signal shall not be distorted through the interference suppression, in order not to falsify the acoustic auditory impression. More particularly, the invention aims to provide an apparatus, further developed from the above-discussed general type of apparatus for ground-borne noise-based fault location, for suppressing interference in the received acoustic signal and thereby improving the locating result. The invention further aims to avoid or overcome the disadvantages of the prior art, and to achieve additional advantages, as apparent from the present specification.

The above objects have been achieved in an apparatus according to the invention, which includes a portable receiver and an interference suppression arrangement. The portable receiver is portably movable to any selected detection location, and comprises an electromagnetic sensor to detect electromagnetic received signals which originate from the fault location, and an acoustic sensor to detect acoustic received signals which originate from the fault location but are also superimposed with interference noise signals. The interference suppression arrangement comprises a memory, a processing unit, a timing unit and an evaluation unit. The memory stores the successive acoustic received signals. The processing unit is connected to the memory and executes a signal processing algorithm by which the acoustic received signals are processed with reference to or in combination with previous stored acoustic received signals, so as to eliminate or reduce interference. The timing unit is connected to the electromagnetic sensor as well as the memory and/or the processing unit, and synchronizes the signal processing with start time points of the acoustic received signals by reference to detected start time points of the electromagnetic received signals respectively associated with the respective acoustic received signals. The evaluation unit allows the output result of the signal processing to be evaluated so as to be able to locate the fault in the electrical line.

In the interference suppression or removal by the signal processing, it is taken into consideration that the time function of the repetitively arising time-limited useful acoustic signals does not significantly vary or differ during the course of a measurement at a given location, while the interference signals arise stochastically or randomly. In other words, the successive useful acoustic signals are expected to be the same or substantially similar to one another with respect to the time function thereof, while the successive interference noises are random and thus not the same or similar to one another. Thus it is possible to process the time-limited useful signals through a processing algorithm, with the aid of the magnetic pulse as a starting point for the signal processing, and thereby to significantly suppress the acoustic interference signals without distorting the useful signal. For example, the signal processing preferably involves forming an average of plural successive acoustic received signals. Because the successive acoustic useful signals emitted by the fault and included in the interference-burdened received signals are all similar to one another (with respect to the amplitude function over time), therefore the average of the useful signal information included in the average of several successive received signals will also be similar to the original useful signals. On the other hand, because the interference noises occur with random amplitudes at random times, the average of the interference noises included in several successive received signals will tend to "smooth-out" or minimize the interference because the random noises in successive received signals will tend to cancel each other out or at least not supplement one another in the average formation. In other words, the average formation tends to maintain signal components that are repetitive and similar among several successive received signals, but tends to minimize or smooth-out signal components that occur randomly and not in a regular repetition in the successive received signals.

In an advantageous further embodiment, it is provided that the evaluating unit is embodied as an audio channel, for example including a loudspeaker for an audible output of an audible signal that can be evaluated or interpreted by a user of the apparatus for locating the electrical fault in the electrical cable.

In order to take into account a change of location of the portable receiver, the receiver preferably further includes a motion detector and/or a contact sensor integrated in the receiver. This motion detector and/or contact sensor automatically triggers a new start of the signal processing algorithm in the arithmetic unit or processing unit for eliminating interference from the acoustic received signals after the portable receiver has been relocated, for example along the ground surface above the buried electrical cable while localizing the fault location.

BRIEF DESCRIPTION OF THE DRAWINGS

In order that the invention may be clearly understood, it will now be described in further detail in connection with an example embodiment thereof, with reference to the accompanying drawings, wherein.

Figure 1:
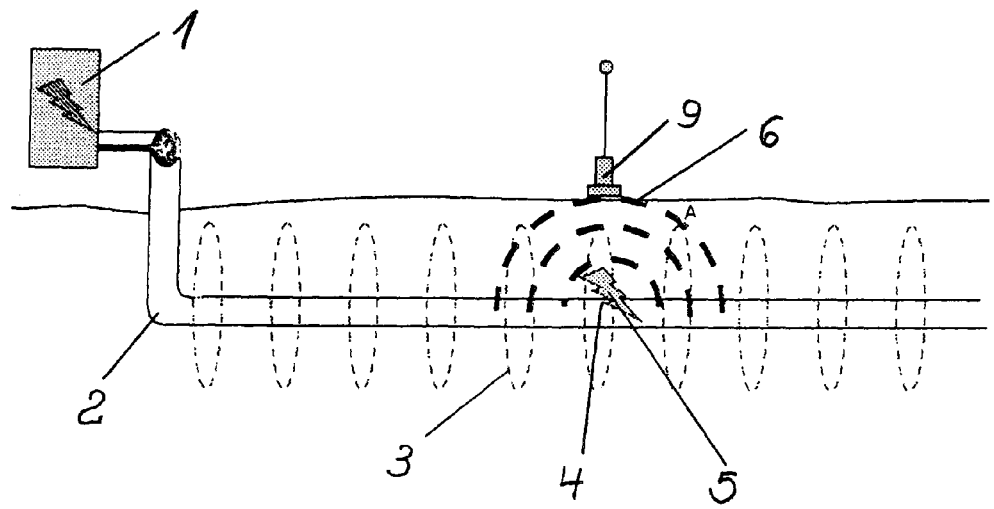
FIG. 1 schematically shows a principle construction of the apparatus according to the invention for carrying out an acoustic post-location or fine location of a fault in an underground electrical cable.

DETAILED DESCRIPTION OF A PREFERRED
EXAMPLE EMBODIMENT AND BEST MODE
OF THE INVENTION

With an apparatus for carrying out an acoustic post-locating process it is provided to precisely carry out a point-exact localization of faults in underground buried cables in a tract of land or ground.

For this, by means of a surge or shock voltage generator 1, surge or shock voltage pulses are supplied into the faulty cable 2 while forming a magnetic field signal 3, and the voltage pulses lead to sparking arc-overs 5 at a fault location 4. Each sparking arc-over at the fault location causes the emission of a corresponding acoustic sound pulse or acoustic emitted signal, which propagates in the ground and is detected in an acoustic received signal 6 at the ground surface, which may however include interference noise superimposed on the acoustic emitted signal. A portable receiver unit 9 consists of a magnetic field sensor 7 (which detects the magnetic field signal 3) and an acoustic sensor 8 (which detects the acoustic received signal 6), as well as an indicating or display unit that is not shown in detail.

In the noise location process, the sparking arc-over noises are evaluated. The evaluation of the time difference between the arrival of the magnetic signal 3 and the arrival of the acoustic signal 6 at the detection location at which the portable receiver 9 is located, makes it possible to determine the distance from the detection location to the fault location. The time difference between the two signals 3 and 6 diminishes when approaching closer to the fault location 4 and ends in a clearly evident minimum directly over the fault location.

As mentioned above, interference noises are superimposed on the useful information of the acoustic emitted signal 6, and are received together with the useful information by the acoustic sensor 8 at the detection location. The interference noises impair an exact fault location determination, because they make it more difficult to accurately evaluate the useful sound information. Therefore, the present example embodiment of the apparatus according to the invention aims to suppress the interference noises by means of suitable signal processing. In this regard it is taken into consideration that the time functions of the successive time-limited useful acoustic pulses do not significantly differ during a measurement, but the arising interference noises occur stochastically and generally have time functions that do not repeat regularly during successive acoustic emitted pulses. These interference noises are suppressed by a method according to the invention, embodied in a signal processing within the inventive apparatus, whereby a better identification of the sparking arc-over noises is made possible.

For eliminating interference from the acoustic received signals 6, these received analog signals are digitized and made time-discrete via the acoustic sensor 8 as a ground-borne noise microphone, possible further comprising an analog-to-digital converter, and subsequently the digitized signals are stored one after another in a memory 10. In this regard it is decisive that the starting time point of the memory storage of the respective acoustic signals is determined absolutely exactly without fluctuations based on the time of receiving the respective arising magnetic signal, via a timing unit 14. The thusly acquired acoustic signals are delivered to a processing unit 11 for signal processing thereof, involving an average value formation (preferably by exponential averaging) of several successive acoustic received signals (or the respective digitized time samples thereof). The result is transferred to an evaluating unit 12, which in this case is embodied as an audio channel.

In this regard, the processing or computing unit 11 is controlled by a signal of a motion sensor 13 and/or of a contact sensor of the receiver unit 9, in order to end and re-start the signal processing algorithm in the processing unit 11 for the average value formation each time when the receiver unit 9 is shifted or relocated to a new detection location.

In the signal processing it is to be taken into consideration, that the acoustic signals stored in the memory 10 consist of a finite number A of samples of the time-discrete acoustic signal $x(k)$ with a sampling period $T_a$, which ultimately must also be intermediately stored in the memory 10.

Figure 3:
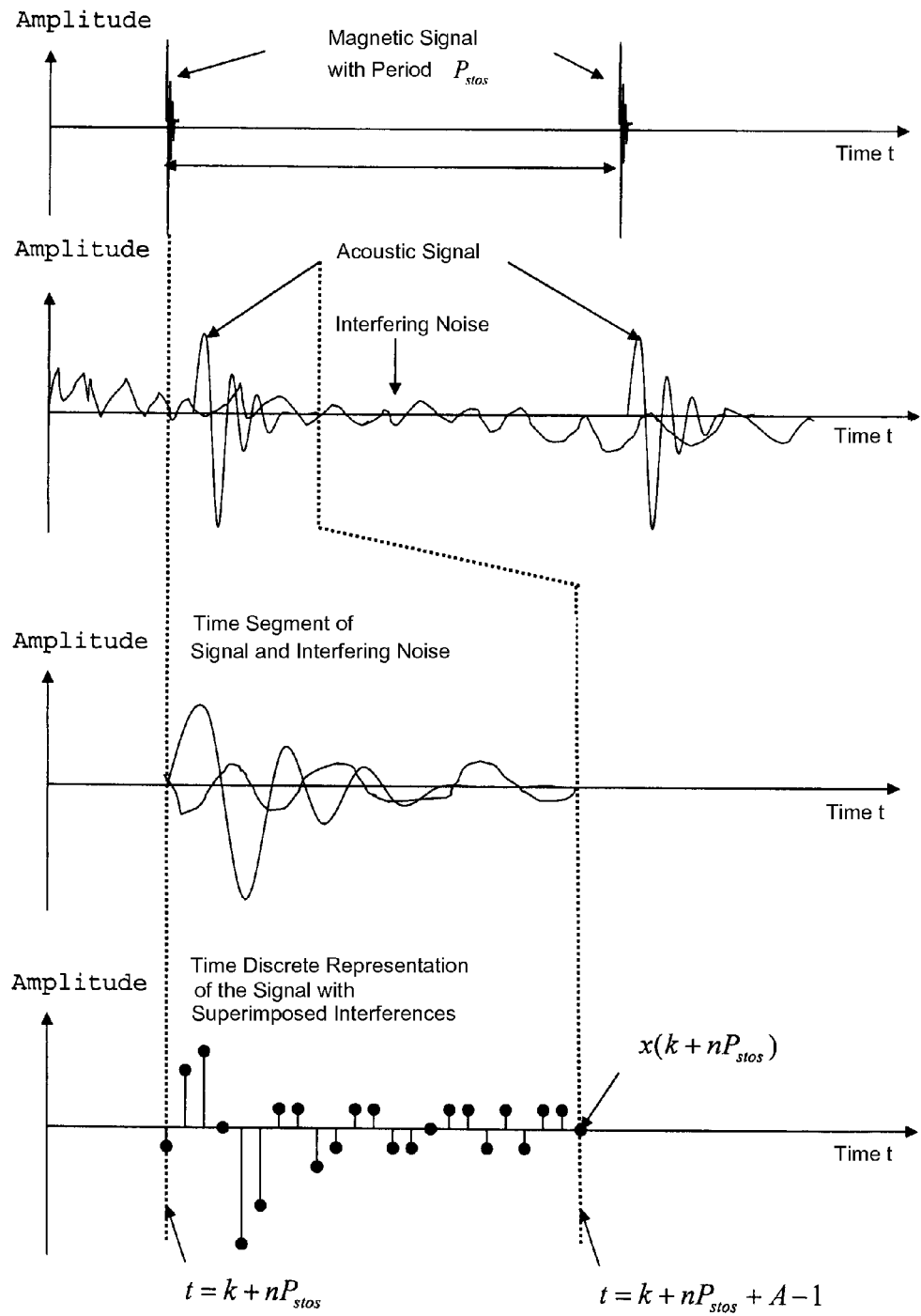
FIG. 3 shows a diagram of the amplitude of an electromagnetic (or magnetic) received signal over time, a diagram of the amplitude of an acoustic received signal over time, a diagram of a single short time segment of the amplitude of the electromagnetic received signal over time with an expanded time scale, and a diagram of the time discrete digitized or sampled electromagnetic received signal during the abovementioned time segment which is then to be stored.

An acoustic signal of the $n^{th}$ surge or shock pulse stored in the memory is defined in the following as a data vector $\vec{V}_n$ $$\vec{V}_n = [x(k+nP_{stos}) \ldots x(k+nP_{stos}+A-1)]$$

wherein $x(k+nP_{stos})$ is the respective first sample and $x(k+nP_{stos}+A-1)$ is the last sample of the $n^{th}$ stored acoustic signal. In this regard it was assumed, that the arriving magnetic and acoustic signals repeat periodically with the surge or shock period $P_{Stoss}$. This is graphically illustrated in FIG. 3.

In one embodiment, the averaging process forms a first average value of the first discrete sample of several successive acoustic received signals, a second average value of the second discrete sample of several successive acoustic received signals, and so forth, up to an $n^{th}$ average value of the $n^{th}$ discrete sample of the successive acoustic received signals. Then the n average values are assembled to produce a discrete representation of the overall average of the acoustic received signals. This output of the processing unit is provided to the evaluating unit, where the average signal may, for example, be converted to an average analog signal in a digital-to-analog converter, and the resulting average analog signal may be provided to further audio channel components, for example comprising an audio output loudspeaker.

Figure 4:
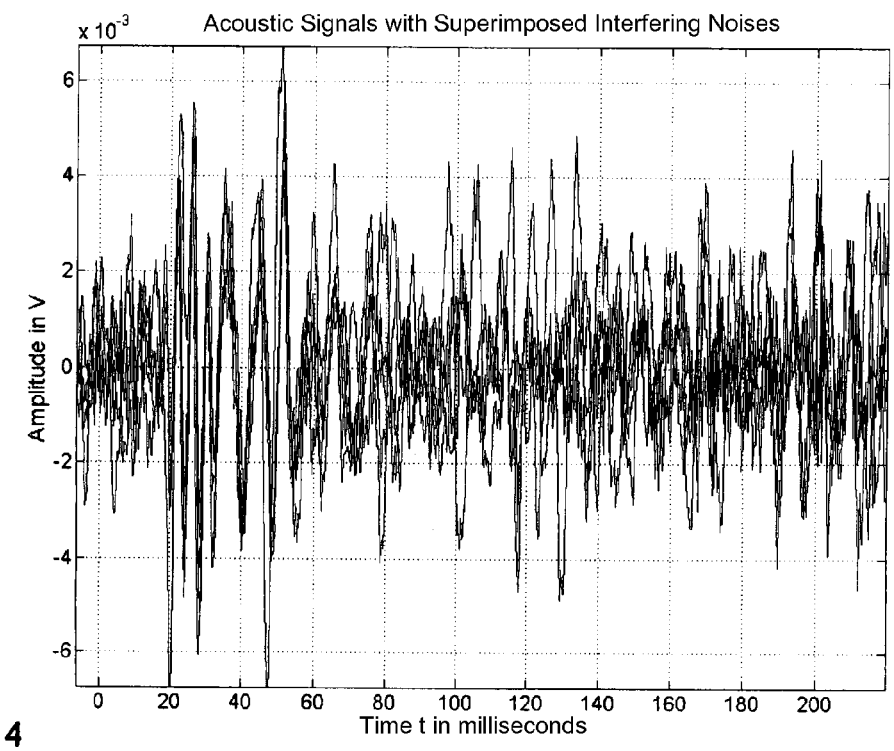
FIG. 4 a diagram of the amplitude over time of several acoustic received signals superimposed on one another, with the aid of the magnetic signal as a timing reference point.
Figure 5:
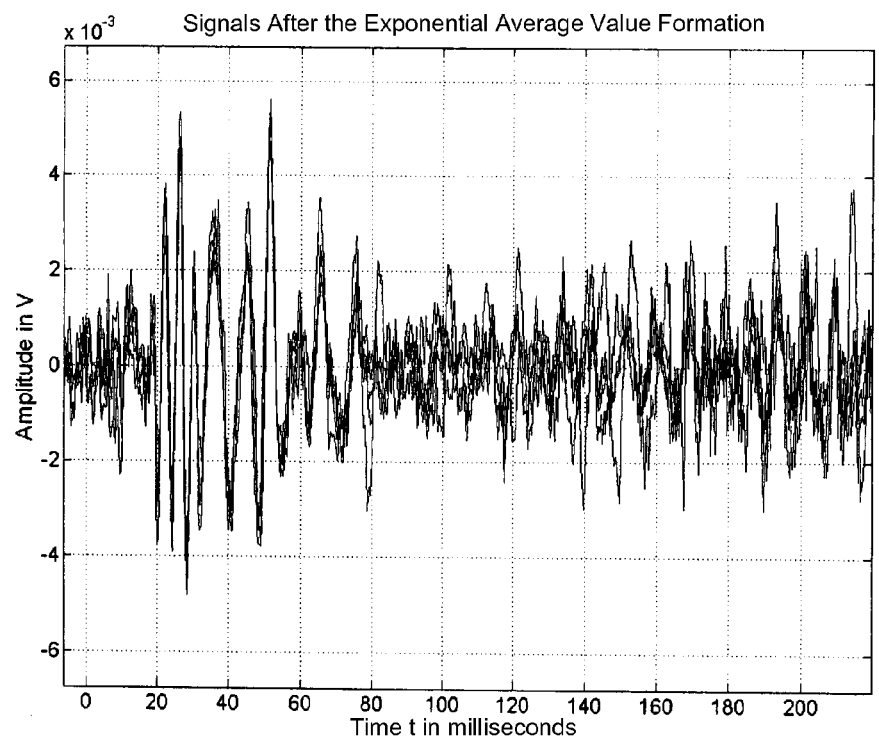
FIG. 5 a diagram like FIG. 4, but showing the results after an average value formation of the several acoustic received signals, whereby clearly reduced interference signal levels are apparent.

In the final resultant average signal, the random noise has been minimized or suppressed, while the useful signal information of the acoustic emitted signals is maintained, averaged and thereby clarified in contrast to the suppressed interference. The improvement of the recorded acoustic signals (FIG. 4) through the use of the described method is illustrated in FIG. 5. Clearly recognizable is the reduction of the interfering noises while maintaining the sparking arc-over noise, and thus the result is an improvement of the audio quality. Thereby, the sound-based localization is facilitated and the result thereof has an improved accuracy.

Figure 2:
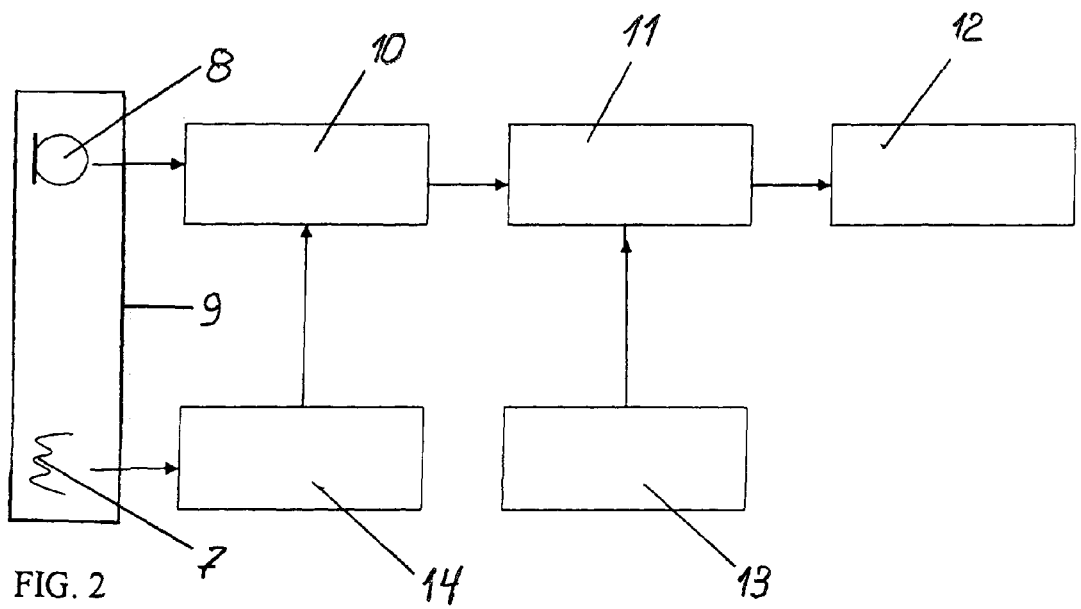
FIG. 2 is a schematic block circuit diagram of some pertinent components of the inventive apparatus for carrying out an interference suppression through an average value formation.

The several components of the apparatus as shown in FIG. 2 are connected for signal transmission with one another as necessary for carrying out the processing as disclosed herein. This means that one component is connected with another component to enable a signal transmission either bidirectionally or unidirectionally therebetween. For example, any one or more of the connections can comprise a hard-wired electrical or optical conductor connection, or a wireless IR of RF signal transmission link. The connections are merely schematically represented as lines in FIG. 2.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims. The abstract of the disclosure does not define or limit the claimed invention, but rather merely abstracts certain features disclosed in the application.

What is claimed is:

1. An apparatus for locating a fault at a fault location in an electrical cable, wherein at least the fault location of the cable is covered by a cover medium, and wherein said apparatus comprises:
    an electrical voltage pulse generator adapted to feed into the cable a sequence of voltage pulses that respectively cause voltage discharges, arc-overs, breakdowns, breakthroughs and/or sparking arcs at the fault, which cause emission from the fault of a sequence of acoustic emitted signals and a sequence of electromagnetic emitted signals respectively associated with the acoustic emitted signals and wherein the acoustic emitted signals and the electromagnetic emitted signals respectively propagate through the cover medium from the fault location to one or more detection locations;
    a portable receiver that is portably movable to be selectively located at any selected one of the detection locations, and that comprises an electromagnetic sensor adapted to detect at said selected detection location electromagnetic received signals including said electromagnetic emitted signals, and an acoustic sensor adapted to detect at said selected detection location plural successive acoustic received signals including said acoustic emitted signals and acoustic interference noises superimposed on said acoustic emitted signals; and
    an interference suppression arrangement that is connected for signal transmission with said portable receiver, and that is adapted to reduce or eliminate the interference noises from the acoustic received signals, and that comprises:
        a memory that is connected for signal transmission with said acoustic sensor, and that is adapted to store the plural successive acoustic received signals,
        a processing unit that is connected for signal transmission with said memory, and that stores and is adapted to execute a signal processing algorithm by which a respective one of the acoustic received signals is subjected to a signal processing with reference to or in combination with a preceding one of the plural successive acoustic received signals stored in said memory, wherein said signal processing eliminates, reduces or suppresses said acoustic interference noises included in said acoustic received signals,
        a timing unit that is connected for signal transmission with said electromagnetic sensor, and that is connected for signal transmission with at least one of said memory and said processing unit, and that is adapted to synchronize the signal processing with start time points of the acoustic received signals by reference to detected start time points of respective ones of the electromagnetic received signals respectively associated with respective ones of the acoustic received signals, and
        an evaluation unit that is connected to an output of said processing unit, and that is adapted for evaluating or outputting an output result of the signal processing according to said signal processing algorithm by said processing unit.

2. The apparatus according to claim 1, wherein the electrical cable is buried in the ground, the cover medium comprises soil of the ground, and the detection locations are locations on a ground surface of the ground.

3. The apparatus according to claim 1, wherein said evaluation unit comprises an audio channel.

4. The apparatus according to claim 3, wherein said audio channel comprises a loudspeaker adapted to output the output result of the signal processing as an audible signal that can be audibly evaluated by a user of said apparatus.

5. The apparatus according to claim 1, wherein said portable receiver further comprises a motion detector arrangement adapted to detect and signal a movement of said portable receiver, wherein said motion detector arrangement is connected for signal transmission with said processing unit and is adapted to trigger a restart of the signal processing by said signal processing algorithm in response to said motion detector arrangement signaling the movement of said portable receiver.

6. The apparatus according to claim 5, wherein said motion detector arrangement is adjustable for adjusting the triggering of the restart of the signal processing.

7. The apparatus according to claim 1, wherein said portable receiver further comprises a contact sensor arrangement adapted to detect and signal a contact of said portable receiver with the cover medium at any selected one of the detection locations, wherein said contact sensor arrangement is connected for signal transmission with said processing unit and is adapted to trigger a restart of the signal processing by said signal processing algorithm in response to said contact sensor arrangement signaling the contact of said portable receiver with the cover medium.

8. The apparatus according to claim 5, wherein said contact sensor arrangement is adjustable for adjusting the triggering of the restart of the signal processing.

9. The apparatus according to claim 1, wherein said signal processing algorithm stored in said processing unit comprises an average value formation algorithm.

10. The apparatus according to claim 1, further comprising a digitizer that is interposed between said acoustic sensor and said memory, and that is adapted to digitize each one of the acoustic received signals into a respective succession of a finite number of discrete time samples of the respective acoustic received signal, and said memory is adapted to store the discrete time samples of each one of a plurality of the acoustic received signals.

11. The apparatus according to claim 10, wherein said signal processing algorithm stored in said processing unit is an average value formation algorithm adapted to form a respective average discrete value of each one of the discrete time samples over a plurality of the acoustic received signals, and to output the average discrete values in the output result.

12. The apparatus according to claim 11, wherein said evaluation unit comprises a loudspeaker and a digital-to-analog converter interposed between said output of said processing unit and said loudspeaker.

13. The apparatus according to claim 11, wherein said average value formation algorithm is an exponential averaging algorithm.

14. An arrangement for eliminating acoustic interference from acoustic signals in a ground-borne noise locating process for locating a fault in an underground buried electrical line through localization of repeating sparking arc-overs at a fault location caused by a connected voltage pulse device, using a portable receiver, which, in addition to an acoustic sensor, comprises a magnetic field sensor for detecting simultaneously arising magnetic pulses in connection with the sparking arc-overs, characterized in that the detected acoustic pulses which are detected by the acoustic sensor are delivered to and stored in a memory, and a respective detected acoustic pulse is processed with reference to or in combination with a previous detected acoustic pulse stored in the memory, by a processing unit through a processing algorithm, and start time points of the individual acoustic pulses are synchronized by reference to the respective associated detected magnetic pulses, wherein the processing by the processing algorithm eliminates, reduces or suppresses acoustic interference included in the detected acoustic pulses, and the result of the processing algorithm from the processing unit is delivered to an evaluating unit.

15. The arrangement according to claim 14, characterized in that the evaluating unit is embodied as an audio channel.

16. The arrangement according to claim 14, characterized in that the portable receiver further comprises a motion detector, which signals a position change of the receiver and which is adjustably settable for triggering a new start of the algorithm in the processing unit.

17. The arrangement according to claim 14, characterized in that the portable receiver further comprises a contact sensor, which is adjustably settable for triggering a new start of the algorithm in the processing unit.

18. Arrangement according to claim 14, characterized in that the processing unit uses an average value formation as the processing algorithm.

19. A method of locating a fault at a fault location in an electrical cable, comprising the steps:
   a) feeding a sequence of voltage pulses from a voltage pulse generator into the cable, to cause emission of a sequence of acoustic emitted signals and a sequence of electromagnetic emitted signals from the fault and propagation of the signals through a cover medium from the fault to a detection location;
   b) using an electromagnetic sensor at the detection location, detecting electromagnetic received signals including the electromagnetic emitted signals;
   c) using an acoustic sensor at the detection location, detecting plural successive acoustic received signals including the acoustic emitted signals and acoustic interference noises superimposed thereon;
   d) storing the plural successive acoustic received signals in a memory;
   e) using a signal processing algorithm executed in a processing unit, subjecting a respective one of the acoustic received signals to a signal processing with reference to or in combination with a preceding one of the plural successive acoustic received signals stored in the memory, so as to eliminate, reduce or suppress the acoustic interference noises included in the acoustic received signals;
   f) using a timing unit, synchronizing the signal processing with start time points of the acoustic received signals by reference to detected start time points of respective ones of the electromagnetic received signals respectively associated with respective ones of the acoustic received signals; and
   g) evaluating or outputting an output result of the signal processing according to the signal processing algorithm by the processing unit.

20. The method according to claim 19, wherein the signal processing algorithm comprises an average value formation algorithm, and the signal processing comprises forming an average value of the plural successive acoustic received signals.

* * * * *